United States Patent
Reis et al.

(10) Patent No.: US 6,255,581 B1
(45) Date of Patent: *Jul. 3, 2001

(54) SURFACE MOUNT TECHNOLOGY COMPATIBLE EMI GASKET AND A METHOD OF INSTALLING AN EMI GASKET ON A GROUND TRACE

(75) Inventors: Bradley E. Reis, Wilmington; David R. King, Newark, both of DE (US)

(73) Assignee: Gore Enterprise Holdings, Inc., Newark, DE (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,080

(22) Filed: Mar. 31, 1998

(51) Int. Cl.[7] ..................................................... H05K 9/00
(52) U.S. Cl. .................................. 174/35 GC; 174/35 R; 174/52.1; 428/364; 307/91; 29/739; 29/840; 29/843; 29/846; 29/850
(58) Field of Search ........................... 174/35 R, 35 GC, 174/52.1; 428/364; 307/91; 29/840, 739, 843, 846, 850

(56) References Cited

U.S. PATENT DOCUMENTS

| | | | |
|---|---|---|---|
| 4,557,957 | 12/1985 | Manniso | 428/36 |
| 4,720,400 | 1/1988 | Manniso | 427/243 |
| 4,857,668 | 8/1989 | Buonanno | 174/35 GC |
| 4,931,479 | 6/1990 | Morgan | 521/76 |
| 5,028,739 | 7/1991 | Keyser et al. | 174/35 GC |
| 5,045,635 | 9/1991 | Kaplo et al. | 174/35 GC |
| 5,105,056 | 4/1992 | Hoge, Jr. et al. | 174/35 GC |
| 5,130,024 | 7/1992 | Fujimoto et al. | 210/500.36 |
| 5,150,282 | 9/1992 | Tomura et al. | 361/474 |
| 5,202,536 | 4/1993 | Buonanno | 174/35 GC |
| 5,209,967 | 5/1993 | Wright et al. | 428/283 |
| 5,250,751 | * 10/1993 | Yamaguchi | 174/35 GC |
| 5,286,568 | 2/1994 | Bacino et al. | 428/422 |
| 5,294,270 | 3/1994 | Fenical | 148/576 |
| 5,401,901 | 3/1995 | Gerry et al. | 174/35 MS |
| 5,429,869 | 7/1995 | McGregor et al. | 428/364 |
| 5,519,172 | 5/1996 | Spencer et al. | 174/110 R |
| 5,524,908 | 6/1996 | Reis | 277/233 |
| 5,656,795 | * 8/1997 | Miska | 174/35 GC |
| 5,684,340 | * 11/1997 | Soler et al. | 307/91 |

FOREIGN PATENT DOCUMENTS

| | | |
|---|---|---|
| 1053932 | 8/1991 | (CN) . |
| 0 594 041 | 4/1994 | (EP) . |
| 2218264 | 11/1989 | (GB) . |
| 61-174700 | 8/1986 | (JP) . |
| 1724739 | 11/1989 | (SU) . |
| WO 97/41716 | 11/1997 | (WO) . |

* cited by examiner

Primary Examiner—William A. Cuchlinski, Jr.
Assistant Examiner—Ronnie Mancho
(74) Attorney, Agent, or Firm—Allan M. Wheatcraft

(57) ABSTRACT

A surface mount technology compatible electromagnetic interference (EMI) gasket assembly includes an electrically conductive gasket material, a solderable electrically conductive support layer, and an adhesive or other mechanical assembly for affixing the electrically conductive gasket material to the support layer.

17 Claims, 6 Drawing Sheets

SURFACE MOUNT TECHNOLOGY COMPATIBLE EMI GASKET AND A METHOD OF INSTALLING AN EMI GASKET ON A GROUND TRACE

FIELD OF THE INVENTION

This invention generally relates to an improved electromagnetic interference (EMI) gasket. More particularly, the present invention relates to an EMI gasket which is compatible with surface mount technology installation equipment.

BACKGROUND OF THE INVENTION

An EMI gasket is a conductive interface material which is used to electrically connect an electrically conductive shield with a corresponding section of an electrical ground, such as a ground trace of a printed circuit board (PCB). Preferably, an EMI gasket should be highly electrically-conductive and conformal. Such a conductive interface material is required when mating surfaces of an electronic apparatus are not exactly conformably dimensioned, such that gaps are formed upon mating engagement of the mating surfaces. These gaps permit undesirable internal and external electromagnetic interference (EMI) which can cause the disruption of the electronic apparatus.

Presently, EMI gaskets are almost exclusively installed directly onto a conductive surface. More particularly, present manufacturing techniques for installing EMI gaskets include the following: dispensing a conductive paste or a conductive liquid material directly onto a conductive surface and curing the dispensed material in-situ; die-cutting a conductive sheet material having an adhesive backer and then transferring, positioning and adhering the dimensioned material directly to a conductive surface; or mechanically fastening a conductive material to a conductive surface.

Although the aforementioned manufacturing and installation techniques are effective in certain instances, shortcomings associated with these manufacturing and installation techniques include: complicated, cumbersome, labor-intensive and expensive automation equipment; and ineffective adhesion to certain conductive surfaces. Additionally, logistic complications may be caused by multiple or even duplicative shipments of parts and materials for processing among a diverse group of vendors.

While discrete, additional EMI gasket installation equipment is generally undesirable and labor-intensive, surface-mount technology (SMT) machines are well-known, high-speed machines which are in widespread use in the electronics industry. For example, SMT machines are widely utilized by cellular phone manufacturers to populate printed circuit boards (PCBs).

As is well understood by those skilled in the art, SMT machines utilize a vacuum head on the end of a high-speed gantry system to pick and place tape-and-reel fed PCB components onto surface-mount pads on a PCB. These pads are usually pre-screened with solder-paste and then sent through a solder reflow oven (such as infrared—IR, vapor-phase, or convection) to melt the solder joints, thereby forming an electrical and mechanical connection.

In an effort to eliminate the use of EMI gaskets, SMT-compatible "cans" were developed, which are simply formed or drawn metal shields that can be soldered to a ground trace of a PCB, thereby effectively forming a Faraday Cage. This serves, therefore, to eliminate the gasket from the entire process. Shortcomings associated with the use of soldered cans include: difficulty in the re-work of a soldered can; inspection of components underneath a soldered can be extremely difficult; and when large cans are desired, the non-flatness of the cans prevents proper solder joints from forming.

Alternatively, metal spring-finger contacts may be employed which can be SMT-fed; however, such metal spring-finger contacts provide only discrete grounding points between a shield and PCB ground trace, and thus are ineffective as operating frequencies continue to rise.

The foregoing illustrates limitations known to exist in present EMI gaskets and EMI gasket installation methods. Thus, it is apparent that it would be advantageous to provide an improved EMI gasket directed to overcoming one or more of the limitations set forth above. Accordingly, a suitable alternative is provided, including features more fully disclosed hereinafter.

SUMMARY OF THE INVENTION

The present invention advances the art of EMI gaskets beyond which is known to date. In one aspect of the present invention, an SMT compatible EMI gasket is provided having a dimensioned, electrically conductive gasket material which is adhered, molded or affixed to a similarly dimensioned electrically conductive support material. The dimensioned electrically conductive gasket material and the electrically conductive support material are disposed in electrical contacting relation, one to each other. The electrically conductive support material is of a material type that effectively forms a bond with solder. In an alternate embodiment of the invention, the electrically conductive gasket material itself may be solderable, eliminating the need for the electrically conductive support material entirely.

The EMI gasket of the present invention is uniquely adapted to be installed utilizing a conventional tape-and-reel SMT compatible system. In such a system, an SMT machine's vacuum (or gripper) head picks and places an EMI gasket directly onto a ground location, such as a location on a ground trace of a PCB, which has been previously screened with solder-paste. At an appropriate manufacturing step, the solder is reflowed thereby bonding the EMI gasket to the ground. The EMI gasket assembly may be employed individually, or in combination with other similar EMI gaskets or additional assemblies, to form a suitable conductive interface.

The electrically conductive gasket material can be fabricated from any suitable electrically conductive material, such as GORE-SHIELD® brand EMI gasket material, type GS500, GS3000 or GS5200, for example. Preferably, the means for affixing the electrically conductive gasket material to the support layer comprises a conductive or non-conductive adhesive. The support layer can be fabricated from any suitable solderable material. Solder paste may also be provided on the support layer for effecting the securement of the support layer to an object of interest, such as a ground trace, during solder reflow operations.

In one embodiment of the present invention, the electrically conductive gasket material is fabricated from an expandable particulate blended into a polytetrafluoroethylene (PTFE) and conductive metal composition. Specifically, in one embodiment, the expandable particulate comprises a polymeric shell having a central core comprised of a fluid material. The central core can include a liquid material or a gaseous material. The polymeric shell has copolymers selected from a group consisting of: vinyl chloride and vinylidene chloride; vinyl chloride and acrylonitrile;

vinylidene chloride and acrylonitrile; methacrylonitrile and acrylonitrile; and styrene and acrylonitrile. In another embodiment, the expandable particulate comprises unexpanded microspheres containing a blowing agent, wherein the blowing agent comprises 5 to 30 percent by weight of the microsphere, and is selected from a group consisting of: ethane; ethylene; propane; butane; isobutane; isopentane; neopentane; acetylene; hexane; and heptane. Alternatively, the blowing agent can include aliphatic hydrocarbons having a number average molecular weight of at least 26, and a boiling point at atmospheric pressure about the same temperature range or below the range of the softening point of the resinous material of the polymeric shell.

In another embodiment of the present invention, the electrically conductive gasket material is fabricated from a mixture comprising: electrically conductive particulate; PTFE, in the form of paste, dispersion or powder; and microspheres, in the form of a dry powder or solution. Specifically, the mixture is mixed in proportions of at least 20 to 90 volume percent conductive particulate, 3 to 15 volume percent microspheres, and 5 to 70 volume percent PTFE, and preferably in proportions of 60 volume percent conductive particulate, 6 volume percent microspheres and 34 volume percent PTFE. The electrically conductive particulate can be selected from a group consisting of: metal powder; metal bead; metal fiber; and metal flake. Alternatively, the electrically conductive particulate can be selected from a group consisting of: metal coated metals; metal coated ceramics; metal coated glass bubbles; metal coated glass beads; and metal coated mica flakes.

In another embodiment of the present invention, the electrically conductive gasket material is fabricated from a polytetrafluoroethylene (PTFE) article having an elastomer material and electrically conductive particles intermixed therein.

In another embodiment of the present invention, a method of installing an electromagnetic interference (EMI) gasket assembly on an electrically conductive object of interest is disclosed, wherein the EMI gasket assembly is of the type comprising an electrically conductive gasket, an electrically conductive solderable support layer, and a means for affixing the electrically conductive gasket to the support layer. The method comprises the steps of: (a) feeding a plurality of EMI gasket assemblies to a surface mount technology (SMT) machine; (b) picking up a selected EMI gasket assembly with a vacuum or gripper head of the (SMT) machine; (c) disposing the selected EMI gasket assembly onto a conductive surface having a solder material disposed therebetween; and (d) reflowing the solder material.

In another embodiment of the present invention, a screen printable conductive adhesive, such as EPO-TEK E2101 from Epoxy Technology, Inc., or the like, will serve to attach the support layer of the EMI gasket (or the EMI gasket itself) to the PCB ground trace. The adhesive, much like the solder, can be silk-screened onto the ground trace in the correct pattern onto the ground trace. In this case, the need for solder is completely eliminated, which has certain potential environmental advantages.

In another embodiment of the present invention, a method of installing an EMI gasket directly on an electrically conductive object of interest is disclosed, wherein the EMI gasket is of the type that can be directly soldered to, without a solderable support layer. The method comprises the steps of: (a) feeding a plurality of EMI gasket assemblies to a surface mount technology (SMT) machine; (b) picking up a selected EMI gasket assembly with a vacuum or gripper head of the (SMT) machine; (c) disposing the selected EMI gasket assembly onto a conductive surface having a solder material disposed therebetween; and (d) reflowing the solder material.

In another embodiment of the present invention, a method of installing an EMI gasket directly on an electrically conductive object of interest is disclosed, without using solder (and with or without a support layer). The method comprises the steps of: (a) feeding a plurality of EMI gaskets or gasket assemblies to a surface mount technology (SMT) machine; (b) picking up a selected EMI gasket or gasket assembly with a vacuum or gripper head of the (SMT) machine; (c) disposing the selected EMI gasket or gasket assembly onto a conductive surface having an adhesive material disposed therebetween; and (d) curing the adhesive material.

Accordingly, a purpose of the present invention is to provide an EMI gasket assembly which can be installed with a standard SMT machine.

Another purpose of the present invention is to eliminate the need for specialized EMI gasket installation equipment.

Another purpose of the present invention is to provide a method of installing EMI gaskets which is simple and which permits rapid EMI gasket design changes.

Yet another purpose of the present invention is to eliminate the need for soldered cans in the design and manufacture of electronic devices.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings embodiments which are presently preferred. It should be understood, however, that the invention is not limited to the precise arrangement and instrumentality shown. In the drawings.

DETAILED DESCRIPTION OF THE INVENTION

Figure 1:
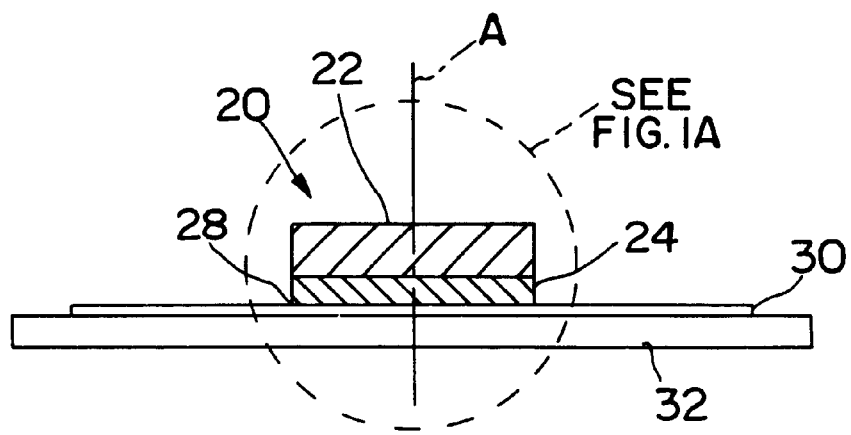
FIG. 1 is an enlarged side elevational view of an EMI gasket assembly of the present invention.
Figure 1A:
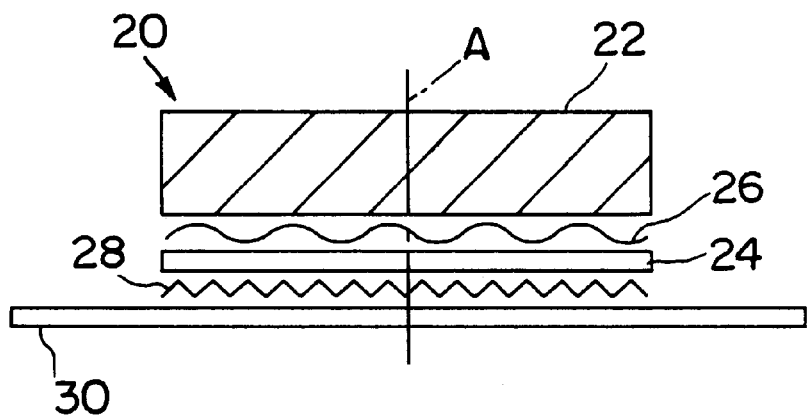
FIG. 1A is an even further enlarged side elevational view of the EMI gasket assembly illustrated in FIG. 1 with its component parts partially exploded.
Figure 1B:
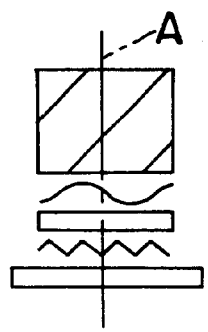
FIG. 1B is a front elevational view of the EMI gasket assembly illustrated in FIG. 1A.

Referring now to the drawings, wherein similar reference characters designate corresponding parts throughout the several views, there is generally indicated at 20 in FIGS. 1, 1A and 1B an electromagnetic interference (EMI) gasket assembly of the present invention. As will be discussed in greater detail below, the EMI gasket assembly 20 can be installed with a standard surface mount technology machine, thereby eliminating the need for specialized EMI gasket installation equipment.

FIG. 1A shows an enlarged side view of the EMI gasket assembly 20, reflecting a preferred embodiment of the invention. Specifically, the EMI gasket assembly 20 comprises an electrically conductive gasket material 22, an electrically conductive solderable support layer 24, means (adhesive 26) for affixing the electrically conductive gasket material 22 to the support layer 24, and a solder layer 28 which secures the entire assembly to a conductive surface, such as a ground trace 30 of a PCB 32 (see FIGS. 1 and 7 which illustrate PCB 32). One type of electrically conductive gasket material which may be particularly suited for use with the present invention is GORE-SHIELD® brand EMI gasket material type GS500, GS3000 or GS5200, available from W. L. Gore & Associates, Inc. of Newark, Del. Other suitable electrically conductive gasket materials will be described in greater detail below.

As the term is used herein "solderable" shall mean capable of fusing, joining, or metallurgically bonding with solder to form an electrically conductive joint, connection or interface.

Figure 2:
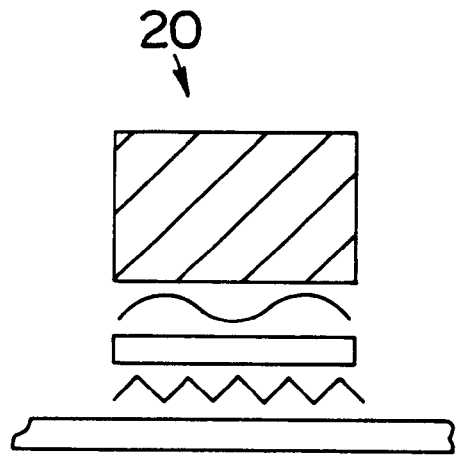
FIGS. 2–5 illustrate front elevational views of EMI gasket assemblies having various shapes.

The electrically conductive gasket material 22 may be rectangular in cross section (from the side) as shown; however, it may also be round, oval, pointed, curled, etc. Such other cross sections of the gasket 22 are illustrated in FIGS. 2–5, wherein FIG. 2 illustrates a rectangular cross section, FIG. 3 a triangular cross section, FIG. 4 a curved or crescent-shaped cross-section and FIG. 5 a half-rounded- and half-rectangular-shaped cross section. Sometimes, the electrically conductive gasket shape is deliberately formed to achieve a desired result, such as to decrease the required force to compress the EMI gasket material with a shield (not shown). This allows for smaller screws or even snaps to fasten the shield to the PCB 32.

It should be noted that suitable means for affixing metal support layer 24 to the lectrically conductive gasket material 22 include, but are not limited to, non-conductive adhesive, electrically conductive adhesive, molding, or mechanical means, such as a barb assembly or retention clips.

Figure 3:
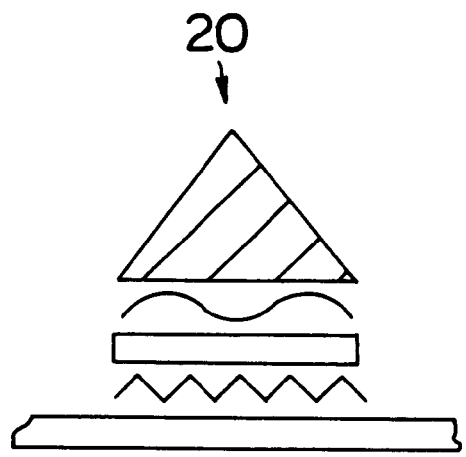
Figure 4:
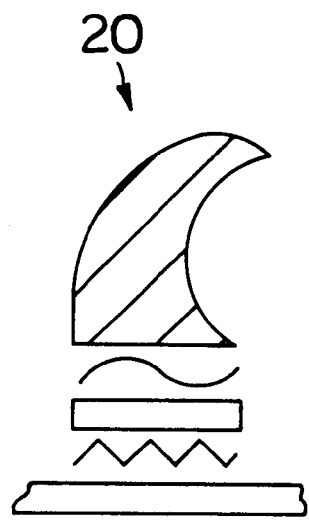
Figure 5:
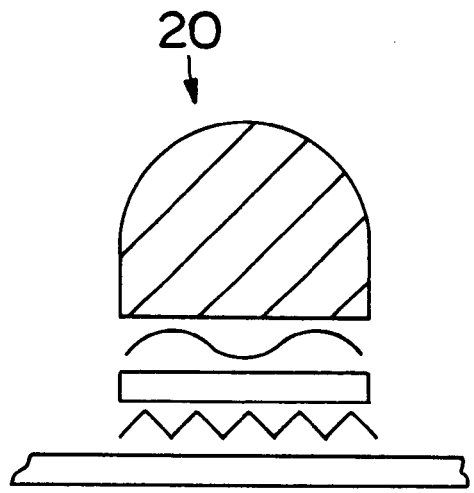

In instances where the adhesive 26 is employed, any suitable adhesive may be used to attach or affix the electrically conductive gasket material 22 to the support layer 24, as long as an electrical path is maintained therebetween. In one embodiment, a particle filled electrically-conductive pressure-sensitive acrylic adhesive may be used. This adhesive is laminated to the gasket in transfer-roll form, but it may be directly applied to the gasket, or applied in some other form. In fact, the adhesive itself is not necessary for affixing the gasket to the support layer. The invention only requires some means to electrically and mechanically connect the gasket to the support layer. An electrically-conductive, pressure-sensitive adhesive is one exemplary way of achieving this attachment; however, the adhesive could also be thermoset, thermoplastic, etc. Also, the adhesive might not need to be electrically-conductive if the support layer 24 can be made to mechanically touch the gasket 22 in some areas to keep an electrical path along a z-axis "A". (FIGS. 1–3.) Additionally, the electrically conductive gasket material 22 could be directly molded to the support material or mechanically fastened in some other manner (such as with support barbs, etc.), thus eliminating the need for an adhesive 26 altogether. Whatever the case, the fastening means must be able to withstand solder reflow temperatures and retain its mechanical and electrical properties.

The support layer 24 should impart sufficient stiffness to the electrically conductive gasket material 22 to permit the assembly to be effectively processed with SMT machines. Thus, the support layer 24 may be made of a variety of different materials, such as plastic or metal; however if it is plastic, it must be plated with a solderable metal such as copper, nickel, gold, silver, tin, etc. If the support layer 24 is metal, it should be easily solderable, or plated with a similar metal such as described above. Gold, nickel and tin are preferred plating materials, and are used extensively in the industry. Also, the support layer 24 may be any thickness, especially if it is desired to fill an existing gap in a design. Thus, the gasket 22 thickness can be kept to a standard thickness, while modifying the support layer 24 thickness to accommodate different designs. Also, the support layer 24 does not need to be rectangular in cross-section, as would occur if the part was stamped or cut from a sheet metal material. For example, the support layer 24 can be molded into a trapezoidal shape, parallelogram, etc., depending upon the application. Whatever material the support layer 24 is fabricated from, it must be able to withstand solder reflow temperatures.

Figure 6:
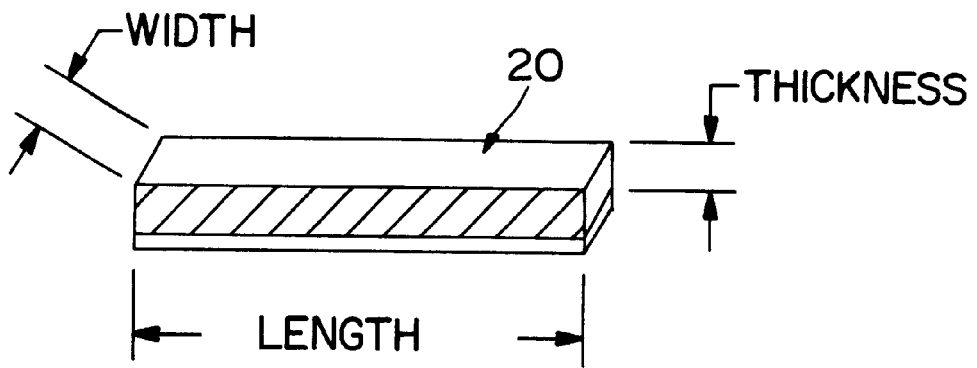
FIG. 6 is a perspective view of an EMI gasket assembly of the present invention.
Figure 7:
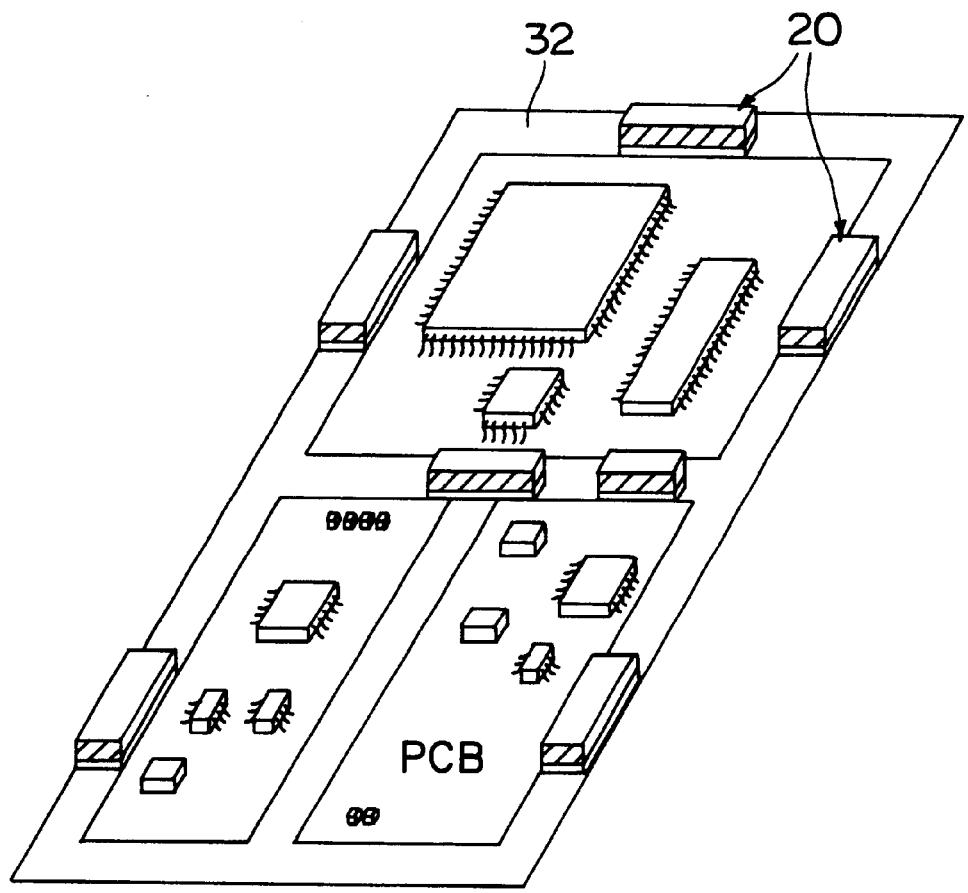
FIG. 7 is a perspective view of the EMI gasket assembly illustrated in FIG. 6 installed onto a ground trace of a printed circuit board (PCB)

FIG. 6 illustrates an example of an EMI gasket assembly 20 contemplated by the instant invention. FIG. 7 shows a typical PCB 32, with several gasket assemblies 20 installed at various locations on ground traces 30. The assembly 20 is dimensioned as shown for illustration purposes only, accordingly assembly 20 can readily be made wider, thicker, longer, thinner, etc., depending upon an application. In the case shown in FIG. 7, the assemblies 20 are hypothetically shown to be installed strategically in desired locations.

Figure 8:
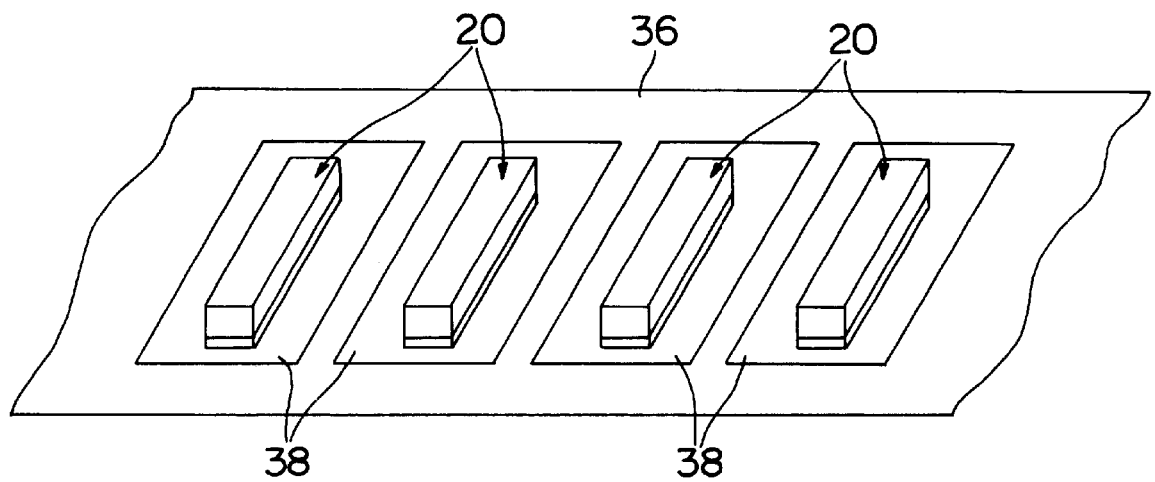
FIG. 8 is a perspective view of a tape and reel assembly used to feed EMI gasket assemblies into a surface mount technology (SMT) machine (not shown)
Figure 9:
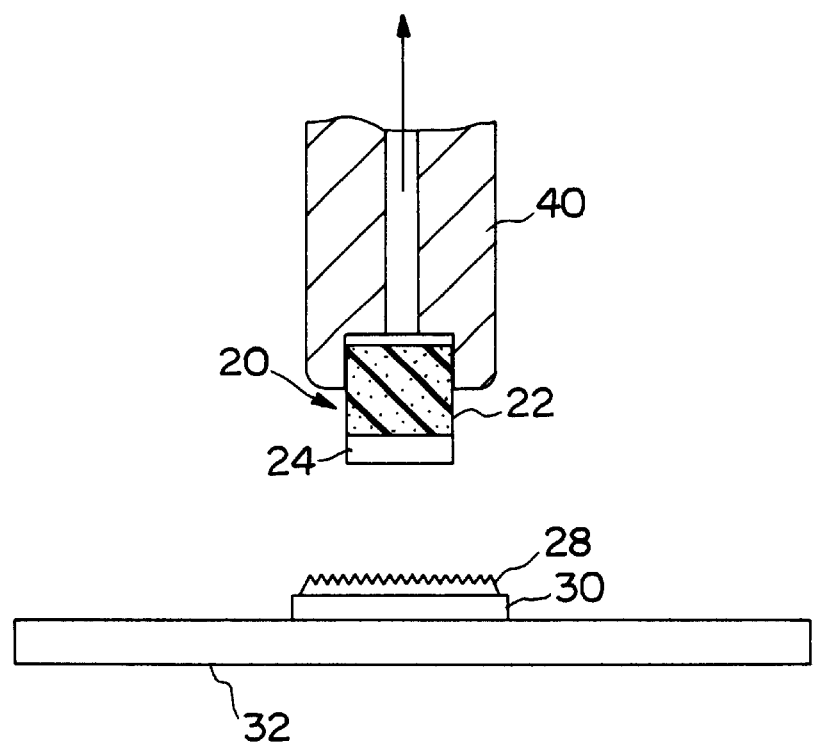
FIG. 9 is an elevational view of a vacuum head of an SMT machine supporting an EMI gasket assembly ready for installation.

Referring now to FIGS. 8 and 9, FIG. 8 shows a typical section of tape and reel 36, used to feed the EMI gasket assembly 20 into an SMT machine. The assemblies 20 are received in pockets 38, which are positioned to allow a vacuum head 40 (FIG. 9) of an SMT machine (not shown) to easily and precisely access and pick up the assemblies 20 from their respective pockets 38 for placement. This process is illustrated in FIG. 9, which reveals a cutaway view of the vacuum head 40 on the SMT machine, holding a gasket assembly 20 ready for installation. The ground trace 30, in FIG. 9, has already been prepared with a screened pattern of solder paste 28, to mate with the support layer 24 of the assembly 20. Once assembly 20 is deposited on ground trace 30, the solder is reflowed by any suitable means, such as a solder reflow oven, for example.

Figure 10:
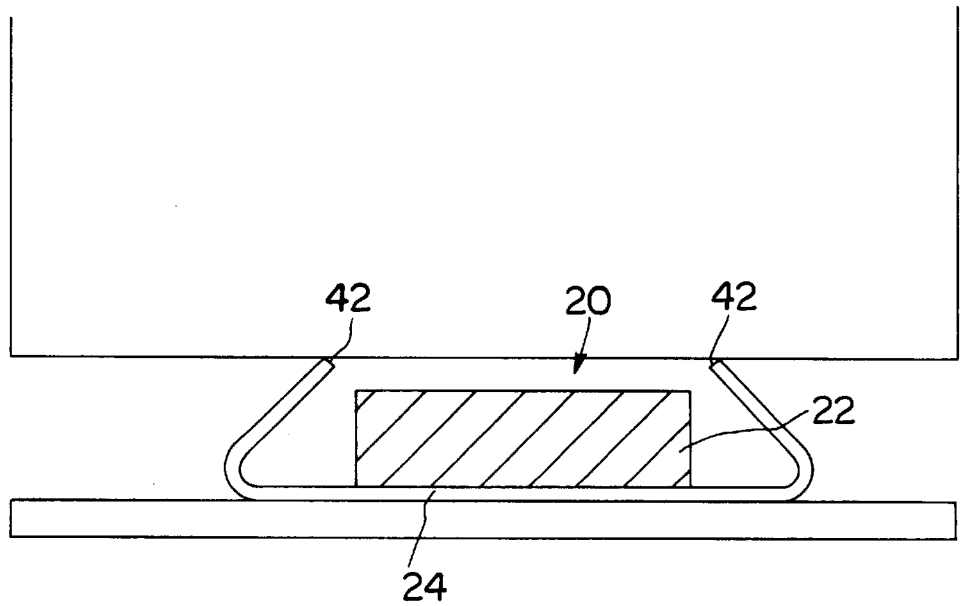
FIGS. 10–12 illustrate alternate embodiments of the present invention in which a support layer of the EMI gasket assembly is extended to form a pair of spring-like fingers.
Figure 11:
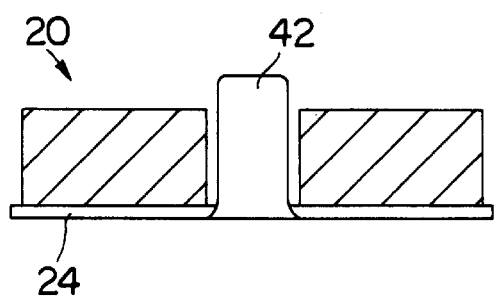
Figure 12:
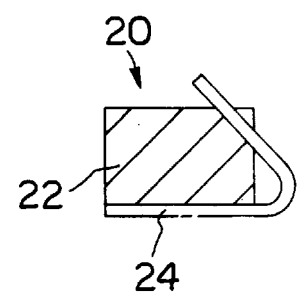

FIGS. 10–12 reveal a pair of alternate embodiments of the present invention. As shown therein, support layer 24 is extended to act as a spring-like finger 42, which gives an improved metal-to-metal configuration. This extra contact of the support layer 24 provides lower resistance for the entire assembly 20 than without it, since the metal or plating typically have better conductivity than the electrically conductive gasket 22 material. Used in this configuration, the assembly 20 is able to give improved performance over an assembly without the extra contacts. In the drawing figures, one embodiment (FIG. 10) shows a pair of spring fingers 42, folded over at the ends, while the other embodiment (illustrated in FIGS. 11 and 12) reveals a single finger 42 at the center. Other configurations similar to the ones illustrated in FIGS. 10–12 are further contemplated.

Figure 13:
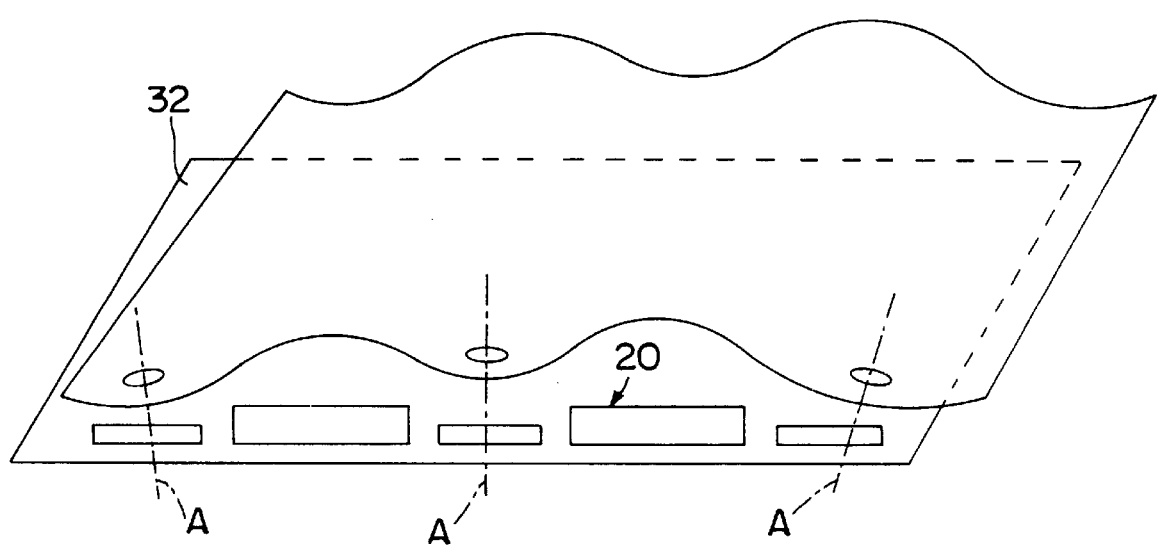
FIG. 13 is a perspective view of a set of five EMI gasket assemblies of the present invention.

Lastly, FIG. 13 shows a set of five EMI gasket assemblies 20, of varying thicknesses, used in combination. This configuration might be used to combat flexing in a mating shield, which tends to bow away from the PCB 32 between housing fastening locations. This can give improved performance over a set of gasket assemblies with identical thicknesses.

As stated hereinabove, any suitable electrically conductive material may be used in the construction of an SMT compatible EMI gasket 20 in accordance with the teachings of the present invention. The embodiments of suitable conductive gasket material provided hereinbelow are provided for purposes of illustration only, and are not intended to limit the scope of the present invention.

Electrically Conductive Gasket Materials

A first suitable electrically conductive gasket material 22 may be fabricated from an electrically conductive polymer matrix of the type described in detail in U.S. Pat. No. 5,431,571, and which is incorporated herein by reference.

A second suitable electrically conductive gasket material 22 may be fabricated from an electrically conductive gasket material of the type described in detail in U.S. Pat. No. 5,286,568, and which is incorporated herein by reference.

A third suitable electrically conductive gasket material 22 may be fabricated from material of the type described in detail in U.S. Pat. No. 5,604,026, and which is incorporated herein by reference.

A fourth suitable electrically conductive gasket material 22 may be an electrically conductive polytetrafluoroethylene (PTFE) article which has an expandable particulate blended into a PTFE and conductive metal composition. Specifically, the expandable particulate exhibits intumescence upon application of heat. The expandable particulate is not homogeneous, i.e., it is not a polymeric bead, but rather comprises a polymeric shell having a central core comprised of a fluid material. A further characteristic is that the overall dimensions of the expandable particulate increase upon heating at a specific temperature.

Expandable hollow polymeric particulate which is useful includes those materials comprised of a polymeric shell and a core of at least one other material, either liquid or gaseous, most preferably a liquid at room temperature, in which the polymeric shell is essentially insoluble. A liquid core is advantageous because the degree of expansion is directly related to the volume change of the core material at the expansion temperature. For a gaseous core material, the volume expansion expected can be approximated from the general gas laws. However, expandable particulate comprising a liquid core material offers the opportunity to provide much larger volume changes, especially in those cases where a phase change takes place (i.e., the liquid volatilizes at or near the expansion temperature).

Preferred expandable polymeric particulate (also called microspheres, microballoons, and microbubbles) can have shells comprising copolymers such as vinyl chloride and vinylidene chloride, copolymers of vinyl chloride and acrylonitrile, copolymers of vinylidene chloride and acrylonitrile, copolymers of methacrylonitrile and acrylonitrile, and copolymers of styrene and acrylonitrile. Further materials worth mentioning are copolymers of methyl methacrylate containing up to about two percent by weight of styrene, copolymers of methyl methacrylate and up to about 50 percent by weight of ethyl methacrylate, and copolymers of methyl methacrylate and up to about 70 percent by weight of orthochlorostyrene. The unexpanded microspheres contain fluid, preferably volatile liquid, i.e., a blowing agent, which is conventional for microspheres of the type described here. Suitably, the blowing agent is 5 percent to 30 percent by weight of the microsphere. The microspheres can be added in different manners, as dried particles, wet cakes, or in a suspension, e.g., in an alcohol such as isopropanol.

Unexpanded particulate desirably is in the size range of from about 0.1 micrometer to about 600 micrometers, preferably from 0.5 micrometer to 200 micrometers, and most preferably from 1 micrometer to 100 micrometers. Expanded particulate can have a size in the range of from about 0.12 micrometer to 1000 micrometers, preferably from 1 micrometer to 600 micrometers. After expansion, the volume of the expandable particulate increases by a factor of at least 1.5, preferably by a factor of at least 5, and most preferably by a factor of at least 10, and may even be as high as a factor of about 100.

Suitable microspheres are commercially available from Nobel Industries of Sundsvall, Sweden, under the trademark EXPANCEL®. These microspheres may be obtained in a variety of sizes and forms, with expansion temperatures generally ranging from 80° C. to 130° C. A typical EXPANCEL® microsphere has an initial average diameter of 9 to 17 micrometers and an average expanded diameter of 40 to 60 micrometers. According to Nobel Industries, the microspheres have an unexpanded true density of 1250–1300 kg/m$^3$, and an expanded density below 20 kg/m$^3$.

It should be understood that the use of the term "energy expandable particulate" herein is intended to encompass any hollow resilient container filled with volatile fluid which is adapted to expand. Although presently available microspheres are essentially ball-shaped particles adapted to expand when exposed to an energy source, it should be understood that such microspheres are quite resilient in their expanded form and can be compressed and released (e.g., through extrusion) to achieve the expansion required for the present invention. Additionally, it may be possible to form such products in a variety of other shapes, such as tubes, ellipsoids, cubes, particles, etc. As such, the term "energy expandable particulate" is intended to include all applicable forms and uses of these products now known or later developed.

A wide variety of blowing or raising agents may be enclosed within the polymeric shell of the expandable microspheres. They can be volatile fluid-forming agents such as aliphatic hydrocarbons including ethane, ethylene, propane, butane, isobutane, isopentane, neopentane, acetylene, hexane, heptane, or mixtures of one or more such aliphatic hydrocarbons, preferably having a number average molecular weight of at least 26, and a boiling point at atmospheric pressure about the same temperature range or below the range of the softening point of the resinous material of the polymeric shell when saturated with the particular blowing agent utilized.

EXPANCEL®-type 091 DU microspheres may be employed. This product comprises an off-white dry powder with a particle size ranging between 10 and 40 micrometers. The shell of these microspheres comprise acrylonitrile whereas the volatile liquid comprises isopentane.

It has been found that by mixing a dry preparation of EXPANCEL® microspheres with a dispersion of PTFE, or similar polymer, and then heating the resulting composition, the polymer will undergo expansion in three-dimensions to achieve a fibrillated PTFE matrix.

In accordance with this embodiment, a precursor material comprised of: electrically conductive particulate; PTFE, in the form of paste, dispersion or powder; and microspheres, in the form of a dry powder or solution, is mixed in proportions of at least 20 to 90 volume percent conductive particulate, 3 to 15 volume percent EXPANCEL® microspheres, and 5 to 70 volume percent PTFE, with proportions of 60 volume percent conductive particulate, 6 volume percent EXPANCEL® microspheres and 34 volume percent PTFE being preferred in an embodiment comprising at least in part electrically conductive flakes. Mixture may occur by any suitable means, including dry blending of powders, wet blending, co-coagulation of aqueous dispersions and slurry filler, high shear mixing, etc. As the term is used herein, "volume percent" shall mean a percentage of the volume of the precursor material.

Electrically conductive particulate enmeshed within the resulting PTFE precursor material is the major component thereof. The electrically conductive particulate may include, but is not limited to, metal powder, metal bead, metal fiber, or metal flake, or it can be a metal coated particulate such as metal coated metals, metal coated ceramics, metal coated glass bubbles, metal coated glass beads, or metal coated mica flakes. Preferred conductive metals in particulate form include, but are not limited to silver, nickel, aluminum, copper, stainless steel, graphite, carbon, gold, or platinum, for example. Preferred metal coatings include silver, nickel, copper, or gold. Additionally, a combination of two or more conductive particulates can be used. Average size of the conductive flakes can be from about 1 $\mu$m to about 200 $\mu$m, preferably from about 1 $\mu$m to about 100 $\mu$m, and most preferably from about 2 $\mu$m to about 40 $\mu$m. Average size for conductive powders can be from about 0.5 $\mu$m to about 200 $\mu$m, preferably from about 0.5 $\mu$m to about 100 $\mu$m, and most preferably from about 2 $\mu$m to about 60 $\mu$m.

The PTFE aqueous dispersion employed in producing the PTFE precursor of the present embodiment can be a milky-white aqueous suspension of PTFE particles. Typically, the PTFE aqueous dispersion will contain about 20 percent to about 70 percent by weight solids, the major portion of such solids being PTFE particles having a particle size in the range of from 0.05 micrometers to about 5.0 micrometers. Such PTFE aqueous dispersions are presently commercially available from the E. I. duPont de Nemours Company, for example, under the tradename TEFLON® 3636, which is 18 percent to 24 percent by weight solids being for the most part PTFE particles of about 0.05 micrometers to about 5.0 micrometers. A thickness of the above described precursor material may range from about 5 mils to about 125 mils, for example.

Upon heating the precursor material, thickness increases due to the expansion of the energy expandable particulate. The amount of expansion observed is dependent on several factors, including the weight percent of energy expandable particulate present, the type of energy expandable particulate, the molecular weight of the polymeric shell of the energy expandable particulate, and the toughness of the PTFE matrix holding the precursor material together. Typical thickness of the material of this embodiment can be in the range of from about at least 10 mils, and preferably from 10 to 100 mils, and most preferably from 20 to 60 mils. Other thicknesses can be achieved.

Temperatures needed for the thermal expansion step to occur are dependent on the type of polymer comprising the shell of the microsphere and on the particular blowing agent used. Typical temperatures range from about 40° C. to about 220° C., preferably from 60° C. to 200° C., most preferably from 80° C. to 190° C.

In addition to the composite article which has been described above, an alternate embodiment may be made by adding an elastomer material, such as a silicone elastomer material (e.g., dimethyl siloxane) to the precursor material. In one embodiment of the present invention, this is achieved by compounding the filled fine powder coagulum with the dimethyl siloxane. A suitable dimethyl siloxane is Sylgard® type 1-4105, or Q1-4010, which may be obtained from Dow Corning. It may also be suitable to use a silicone dioxide reinforced silicone material such as Q3-661, which may also be obtained from Dow Corning. The siloxane is added on a weight per weight basis, and may be diluted with a solvent, such as mineral spirits, for example. In general, the siloxane may be added in amounts ranging from 1 percent to about 50 percent, preferably from 5 percent to about 20 percent, and most preferably from 10 percent to about 15 percent. Other suitable elastomer materials include, but are not limited to, silicone rubbers, fluorosilicone elastomers, fluorocarbon elastomers, perfluoro elastomers, other fluoroelastomer materials, or polyureathane.

Subsequently, this precursor material is heated in a range from about 130° C. to about 190° C., to not only achieve expansion of the precursor material, but also to catalyze the siloxane into a cured state. The resulting article is an easily compressible, continuously electrically conductive PTFE composite, including a silicone elastomer disposed within the composite article in a discontinuous fashion.

The addition of the elastomer material yields a composite with increased z-axis strength, tensile strength and elongation. It also provides some degree of resilience and increases the usable temperature range of the material. These desired properties are achieved without sacrificing electrical conductivity or softness/compressibility of the composite article.

A fifth suitable electrically conductive gasket material 22 includes an electrically conductive polytetrafluoroethylene (PTFE) article which has an elastomer material and electrically conductive particles intermixed therein. Specifically, the conductive gasket material of this embodiment is defined by a plurality of electrically conductive particles and PTFE in the form of paste, dispersion or powder. The electrically conductive particles and PTFE are mixed in proportions to achieve a mixture containing about 50 to 90 volume percent electrically conductive particles. Mixture may occur by any suitable means, including dry blending of powders, wet blending, co-coagulation of aqueous dispersions and slurry filler, or high shear mixing, for example. As the term is used herein, "volume percent" shall mean a percentage of the total volume of a material or mixture.

Electrically conductive particles enmeshed within the resulting composite is a major component thereof. The electrically conductive particles may include, but are not limited to, metal powder, metal bead, metal fiber, or metal flake, or the particles may be defined by a metal coated particulate such as metal coated metals, metal coated ceramics, metal coated glass bubbles, metal coated glass beads, or metal coated mica flakes. Preferred conductive materials in particulate form include, but are not limited to, silver, nickel, aluminum, copper, stainless steel, graphite, carbon, gold, or platinum, for example. Preferred metal coatings include silver, nickel, copper, or gold. Additionally, a combination or mixture of two or more of the foregoing may be employed. Average size of the conductive flakes can be from about 1 $\mu$m to about 200 $\mu$m, preferably from about 1 $\mu$m to about 100 $\mu$m, and most preferably from about 20 $\mu$m to about 40 $\mu$m. Average size for conductive powders can be from about 0.5 $\mu$m to about 200 $\mu$m, and most preferably from about 2 $\mu$m to about 100 $\mu$m.

The PTFE aqueous dispersion employed in producing the electrically conductive composite article of this embodiment may be a milky-white aqueous suspension of PTFE particles. Typically, the PTFE aqueous dispersion will contain about 20 percent to about 70 percent by weight solids, the major portion of such solids being PTFE particles having a particle size in a range from about 0.05 micrometers to about 5.0 micrometers. Such PTFE aqueous dispersions are presently commercially available from the E. I. duPont de Nemours Company, for example, under the tradename TEFLON® 3636, which is 18 percent to 24 percent by weight solids being for the most part PTFE particles of about 0.05 micrometers to about 5.0 micrometers.

An elastomer material, such as a silicone elastomer material (e.g., dimethyl siloxane), is disposed within the conductive gasket material. This is achieved by compounding a filled fine powder coagulum of PTFE and electrically conductive particles with the elastomer material. A suitable dimethyl siloxane is Sylgard® type 1-4105, or Q1-4010, which may be obtained from Dow Corning. (It may also be suitable to use a silicone dioxide reinforced silicone material such as Q3-661, which may also be obtained from Dow Corning.)

The elastomer material, such as the dimethyl siloxane, is added on a weight per weight basis, and may be diluted with a solvent, such as mineral spirits, for example. In general, the elastomer material may be added in amounts ranging from about 1 percent to about 75 percent, preferably from about 5 percent to about 20 percent, and most preferably from about 10 percent to about 15 percent. Other suitable elastomer materials include, but are not limited to, silicone rubbers, fluorosilicone elastomers, fluorocarbon elastomers, perfluoro elastomers, fluoroelastomers, polyurethane, or ethylene/propylene (EPDM).

Subsequent to the addition of the elastomer material, the composite article is heated in a range from about 130° C. to about 190° C., to catalyze the elastomer material into a cured state. The resulting composite article is a continuously electrically conductive composite article having a main body which may be dimensioned into any suitable shape or thickness.

The addition of the elastomer material yields a continuously electrically conductive composite article with an increased z-axis strength and tensile strength. The elastomer also provides some degree of resilience. These desired properties are achieved without sacrificing electrical conductivity.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. A method of installing an electromagnetic interference (EMI) gasket assembly on at least one of a ground trace of a printed circuit board and a conductive surface of an EMI shield, said EMI gasket assembly being of the type comprising an electrically conductive gasket material, said method comprising the steps of:
    a) feeding a selected EMI gasket assembly to a surface mount technology (SMT) machine;
    b) picking up the selected EMI gasket assembly with at least one of a vacuum head and a gripper head of the SMT machine;
    c) disposing the selected EMI gasket assembly onto said one of a ground trace of a printed circuit board and a conductive surface of an EMI shield; and
    d) soldering or adhering the EMI gasket assembly to said one of a ground trace of a printed circuit board and a conductive surface of an EMI shield.

2. A method as defined in claim 1 wherein said electrically conductive gasket material comprises a polymer and conductive particles.

3. A method as defined in claim 2 wherein said polymer comprises polytetrafluoroethylene.

4. A method as defined in claim 2 wherein said electrically conductive gasket material further comprises an elastomer.

5. A method as defined in claim 1 wherein said electrically conductive gasket material is solderable.

6. A method as defined in claim 1 wherein said EMI gasket assembly further comprises an electrically conductive support layer affixed to said electrically conductive gasket material.

7. A method as defined in claim 6 wherein said electrically conductive support layer is solderable.

8. A method as defined in claim 6 wherein an electrical path exists along a Z-axis through said electrically conductive gasket material and said electrically conductive support layer.

9. A method as defined in claim 6 wherein said electrically conductive support layer has at least one end extending beyond the electrically conductive gasket material, said end defining a spring-like finger.

10. A method as defined in claim 6 wherein said EMI gasket assembly further comprises means for affixing said electrically conductive support layer to said electrically conductive gasket material.

11. A method as defined in claim 10 wherein said means for affixing the electrically conductive gasket material to said electrically conductive support layer comprises an adhesive.

12. A method as defined in claim 1 wherein said EMI gasket assembly is adapted for placement by an SMT machine onto a ground trace of a printed circuit board and further comprising a solder layer disposed adjacent to said electrically conductive gasket material for attaching said electrically conductive gasket material to said ground trace.

13. A method as defined in claim 6 wherein said EMI gasket assembly is adapted for placement by an SMT machine onto a ground trace of a printed circuit board and further comprising a solder layer disposed adjacent to said electrically conductive support layer for attaching said electrically conductive support layer to said ground trace.

14. A method as defined in claim 1 wherein said EMI gasket assembly is adapted for placement by an SMT machine onto a conductive surface of an EMI shield and further comprising an adhesive layer disposed adjacent to said EMI gasket assembly for attaching said EMI gasket assembly to said conductive surface.

15. A method as defined in claim 1 wherein said EMI gasket assembly is adapted for placement by an SMT machine onto a conductive surface of an EMI shield and further comprising a solder layer disposed adjacent to said EMI gasket assembly for attaching said EMI gasket assembly to said conductive surface.

16. A method as defined in claim 6 wherein said EMI gasket assembly is adapted for placement by an SMT machine onto a conductive surface of an EMI shield and further comprising a solder layer disposed adjacent to said electrically conductive support layer for attaching said electrically conductive support layer to said conductive surface.

17. A method as defined in claim 1 wherein said SMT machine comprises a vacuum head on a high-speed gantry system adapted to pick and place tape-and-reel fed components.

* * * * *